US006819405B2

(12) United States Patent
Mulkens et al.

(10) Patent No.: US 6,819,405 B2
(45) Date of Patent: Nov. 16, 2004

(54) LITHOGRAPHIC APPARATUS, DEVICE MANUFACTURING METHOD, AND DEVICE MANUFACTURED THEREBY

(75) Inventors: Johannes Catharinus Hubertus Mulkens, Maastricht (NL); Marco Hugo Petrus Moers, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/136,620

(22) Filed: May 3, 2002

(65) Prior Publication Data

US 2002/0180943 A1 Dec. 5, 2002

(30) Foreign Application Priority Data

May 4, 2001 (EP) .............................................. 01304075

(51) Int. Cl.$^7$ .......................... G03B 27/62; G03B 27/42
(52) U.S. Cl. .......................................... 355/75; 355/53
(58) Field of Search .............................. 355/53, 67, 68, 355/72–76; 430/5, 20, 30, 311

(56) References Cited

U.S. PATENT DOCUMENTS

| | | | |
|---|---|---|---|
| 4,456,371 A | 6/1984 | Lin | 355/71 |
| 4,878,086 A | * 10/1989 | Isohata et al. | 355/77 |
| 5,298,365 A | * 3/1994 | Okamoto et al. | 430/311 |
| 5,447,304 A | * 9/1995 | Vargas | 473/489 |
| 5,448,332 A | * 9/1995 | Sakakibara et al. | 355/53 |
| 5,863,677 A | * 1/1999 | Nakao | 430/5 |
| 5,923,403 A | * 7/1999 | Jain | 355/26 |
| 6,134,008 A | 10/2000 | Nakao | 356/363 |
| 6,153,357 A | * 11/2000 | Okamoto et al. | 430/132 |
| 2002/0123012 A1 | 9/2002 | Sewell | |

FOREIGN PATENT DOCUMENTS

| | | | |
|---|---|---|---|
| JP | 60 035516 | | 2/1985 |
| JP | 60035516 | * | 2/1985 |
| JP | 60 107835 | | 6/1985 |
| WO | WO98/32054 | | 7/1998 |

OTHER PUBLICATIONS

A copy of European Search Report dated Nov. 16, 2001, issued in the corresponding European application No. EP 01 30 4075.

A copy of European Search Report dated Aug. 16, 2002, issued in the corresponding European application No. EP 02253151.1.

* cited by examiner

Primary Examiner—Henry Hung Nguyen
(74) Attorney, Agent, or Firm—Pillsbury Winthrop LLP

(57) ABSTRACT

A lithographic projection apparatus including a first radiation system for providing a first projection beam of radiation; a second radiation system for providing a second projection beam of radiation; a support structure for supporting a first patterning structure and a second patterning structure, the first patterning structure serving to pattern the first projection beam according to a first pattern and the second patterning structure serving to pattern the second projection beam according to a second pattern; a substrate table for holding a substrate; a projection system for combining the first and second patterned beams and projecting the combined beam onto a target portion of the substrate.

28 Claims, 4 Drawing Sheets

LITHOGRAPHIC APPARATUS, DEVICE MANUFACTURING METHOD, AND DEVICE MANUFACTURED THEREBY

This application claims priority from EP 01304075.3 filed May 4, 2001, herein incorporated by reference.

FIELD

The present invention relates generally to lithographic apparatus and more particularly to double exposure.

BACKGROUND

In general, a lithographic projection apparatus comprises a radiation system to supply a projection beam of radiation, a support structure to support patterning structure, the patterning structure serves to pattern the projection beam according to a desired pattern, a substrate table to hold a substrate, and a projection system to project the patterned beam onto a target portion of the substrate.

The term "patterning structure" as here employed should be broadly interpreted as referring to structure or means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning structure include:

- A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.
- A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning structure can comprise one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference. In the case of a programmable mirror array, the said support structure may be embodied as a frame or table, for example, which may be fixed or movable as required.
- A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at one time; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and PCT patent application WO 98/40791, incorporated herein by reference.

Lithographic projection apparatus and methods are known in which two masks and two exposures are used for the application of, for instance, dipole illumination in two orientations matched to critical features in said two orientations. Another example of such a two-mask two-exposure approach is the application of dipole illumination for printing dense features with small pitches, and the application of annular illumination for the printing of semi-dense to isolated features with pitches larger than the pitches of said dense features. As in the previous example, the two corresponding exposures are executed consecutively in order to obtain a combined exposure. Both examples of such "double exposure" applications have specific advantages. In the first example, the resolution in said two orientations can be improved over the resolution obtainable with, for instance, single exposure quadrupole illumination. In the second example, optical proximity correction methods can be chosen independently for the two exposures. This extra degree of freedom can be used to alleviate the problem of variation, as a function of pitch, of the dimension of printed features. Further information regarding such double exposure applications can be obtained, for example, from European patent applications EP 00308528.9 and EP 00310368.6, incorporated herein by reference. While such apparatus and methods benefit from improved performance compared to conventional apparatus and methods, a disadvantage is that they require twice as many exposures as conventional apparatus and methods, which consequently substantially halves the throughput.

SUMMARY

In an aspect of at least one embodiment of the present invention, there is provided lithographic projection apparatus and methods that can combine two different mask exposures without substantially reducing throughput. Advantageously, the apparatus and methods allow two different patterns to be projected onto the substrate simultaneously, providing the performance benefits of double exposure methods without substantially increasing the throughput time of the process.

At least one embodiment of the present invention includes a lithographic projection apparatus comprising: a radiation system for supplying a projection beam of radiation; a support structure for supporting a patterning structure, the patterning structure serving to pattern the projection beam according to a desired pattern; a substrate table for holding a substrate; a projection system for projecting the patterned beam onto a target portion of the substrate; a means for providing a supplementary projection beam of radiation; and wherein said support structure is further for supporting supplementary patterning structure, said supplementary patterning structure serving to pattern the supplementary projection beam according to a supplementary pattern which is different to the pattern of the patterning means and both patterned projection beams are projected simultaneously onto the substrate in overlapping registry with one another.

Furthermore, at least one embodiment of the present invention includes a device manufacturing method comprising: providing a substrate that is at least partially covered by a layer of radiation-sensitive material; providing a projection beam of radiation using a radiation system; supporting a patterning structure on a support structure and using it to endow the projection beam with a pattern in its cross-section; projecting the patterned beam of radiation onto a target portion of the layer of radiation-sensitive material; providing a supplementary projection beam of radiation; supporting a supplementary patterning structure on said support structure and using it to endow the supplementary projection beam with a pattern in its cross section that is different to the pattern of the patterning structure; and projecting the supplementary patterned beam onto the layer of radiation sensitive material simultaneously with the patterned beam.

For ease of reference we will, hereinafter, refer to the radiation system as "first radiation system" and a supplementary radiation system as "second radiation system." Similarly, we will refer to the projection beam of radiation, the patterning structure, and the pattern as "first projection beam of radiation," "first patterning structure," and "first pattern," respectively, and to the supplementary projection beam of radiation, the supplementary patterning structure, and the supplementary pattern as "second projection beam of radiation," "second patterning structure," and "second pattern," respectively.

Although specific reference may be made in this text to the use of the apparatus according to at least one embodiment of the present invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
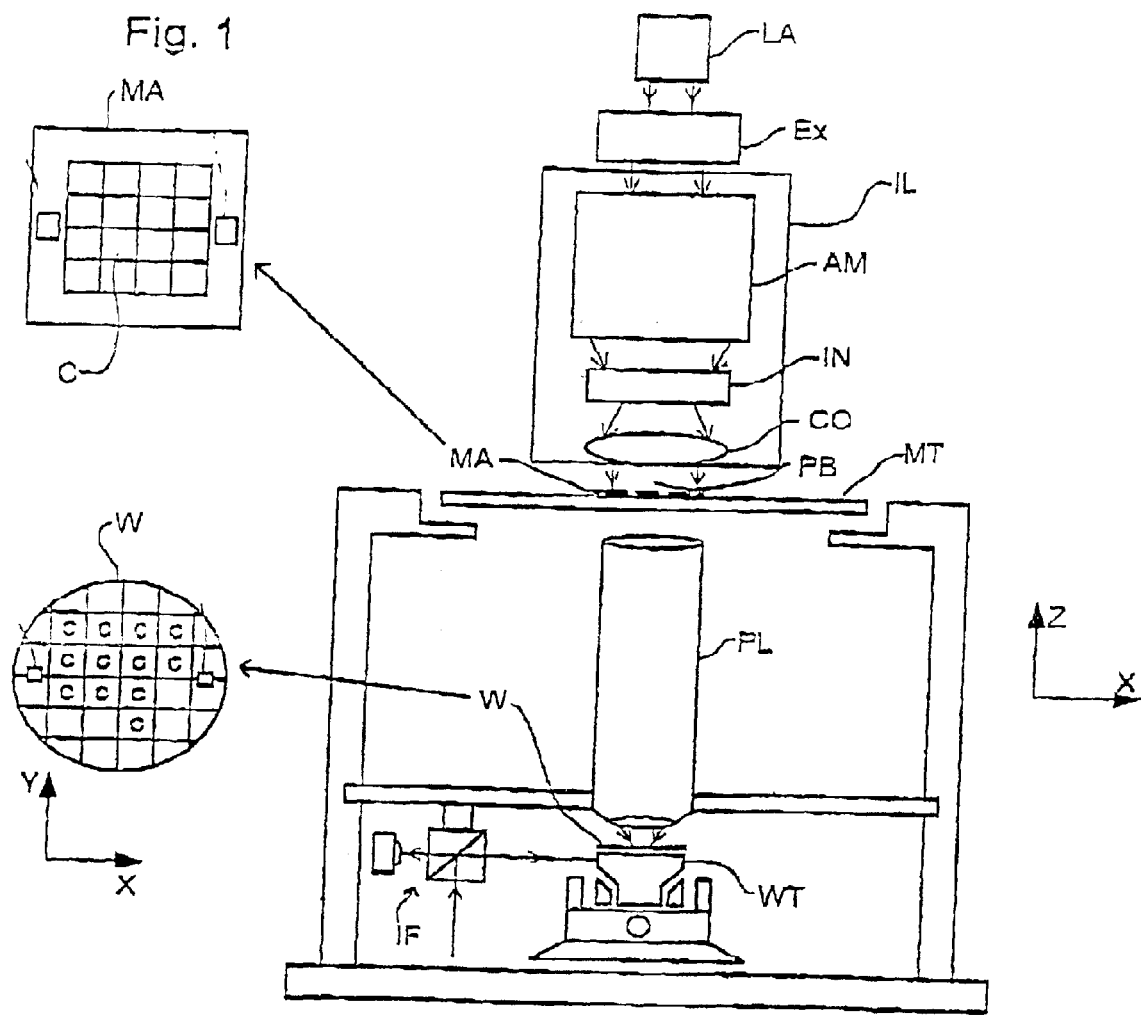
FIG. 1 depicts a lithographic projection according to at least one embodiment of the present invention.

FIG. 1 schematically depicts a lithographic projection apparatus according to at least one embodiment of the present invention. The apparatus comprises:

- a radiation system Ex, IL, for supplying a projection beam PB of radiation (e.g. UV-radiation), which in this particular case also comprises a radiation source LA;
- a first object table (mask table) MT provided with a mask holder for holding a mask MA (e.g. a reticle), and connected to first positioning means for accurately positioning the mask with respect to item PL;
- a second object table (substrate table) WT provided with a substrate holder for holding a substrate W (e.g. a resist-coated silicon wafer), and connected to second positioning means for accurately positioning the substrate with respect to item PL;
- a projection system ("lens ") PL (e.g. a refractive lens system) for imaging an irradiated portion of the mask MA onto a target portion C (e.g. comprising one or more dies) of the substrate W.

As here depicted, the apparatus is of a transmissive type (e.g. has a transmissive mask). However, in general, it may also be of a reflective type, for example, with a reflective mask. Alternatively, the apparatus may employ another kind of patterning structure, such as a programmable mirror array of a type as referred to above.

The source LA (e.g an excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The present invention encompasses at least both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of along-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected at one time (i.e. a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to comprise on resolution.

Figure 2:
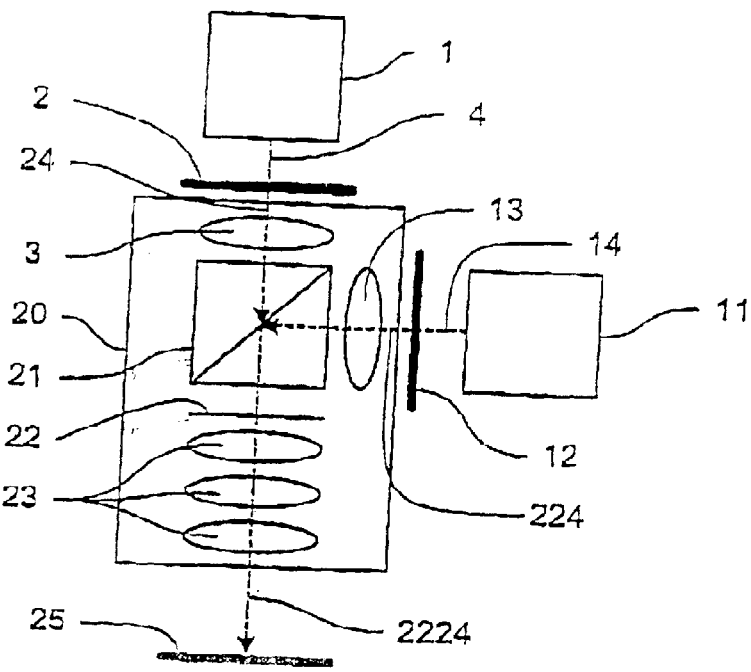
FIG. 2 depicts a schematic arrangement according to at least one embodiment of the present invention.

FIG. 2 shows a schematic arrangement of an apparatus according to at least one embodiment of the present invention. The general operation is the same as described above, with reference to FIG. 1, and will therefore not be repeated.

The apparatus shown in FIG. 2 has a first radiation system 1 and a second radiation system 11, supplying a first projection beam of radiation 4 and a second projection beam of radiation 14, respectively. Each of the radiation systems 1 and 11 comprises an element IL, and may comprise an element Ex, as described above and shown in FIG. 1. The radiation systems 1 and 11 are not necessarily identical. For instance, if the radiation is produced by a single source, the optical path lengths between the source and the entrances of the two radiation systems may not be equal, resulting in different projection beam cross sections at these entrances. This difference may in turn necessitate the use of, for instance, beam expanders, such as Ex in FIG. 1, featuring different beam expansion factors in order to compensate for the difference in said cross-section. However, in general, the two radiation systems can be substantial duplicates of each other. Each radiation system may comprise adjusting means such as, for instance, element AM in FIG. 1 for setting the values of σ-inner and σ-outer, or an adjustable element for generating a multipole illumination mode, for example. The settings of the adjustments of the first radiation system may differ from the settings of the adjustments of the second radiation system so as to, independently of each other, optimize the lithographic quality of the projected image of the first and second pattern, respectively.

The projection beams 4, 14 are patterned by a first mask 2 and second mask 12, respectively, to produce patterned radiation beams 24, 224. In the projection system 20, the first and second patterned radiation beams pass through lenses 3, 13, respectively, and are combined in a polarizing beam-combiner 21 (which is a polarizing beam-splitter, used in reverse). The lenses 3 and 13 may each be used to compensate for (or, if possible, to correct) anomalies of the patterned beams 24 and 224, respectively, with the advantage that compensation (or correction) of the first patterned beam can be effectuated without necessarily affecting the second patterned beam, and vice versa. However, if there is no need for such compensation means, the lenses 3 and 13 may be absent, so that the polarizing beam combiner is upstream of lens elements 23 comprised in the projection system.

According to at least one embodiment, the projection system of the apparatus combines said first and second patterned beams and projects the combined beam onto the target portion of the substrate. This allows many of the components of the projection system to be shared, reducing both the cost and the possibility of errors.

According to at least one embodiment, the first and second projection beams are plane polarized beams which are, upon traversing the first and second patterning structure respectively, combined using a polarizing beam-combiner. The lay out of commercially available polarizing beam combiners usually is such that the beams that are to be combined shall be mutually orthogonal. Hence, it may be advantageous to arrange the radiation systems and the patterning structure in such a way that the patterned beams propagate in mutually orthogonal directions towards the beam combiner.

In order to optimally exploit the beam combining property of a polarizing beam combiner (i.e. to reduce loss of radiation energy) the electromagnetic radiation of the patterned beams 24 and 224 is linearly polarized, such that the electric field of beam 24 is oriented substantially parallel to the plane of FIG. 2 ("P-polarization"), and the electric field of beam 224 is oriented substantially perpendicular to the plane of FIG. 2 ("S-polarization"), for example.

An additional advantage of said states of polarization of the patterned beams occurs in combination with dipole illumination. When a dipole exposure is performed using linearly polarized electromagnetic radiation, where the electric field is oriented substantially perpendicular to the axis joining the two (main) poles in the dipole pattern, and where that axis is then substantially perpendicular to the mask features being imaged in the exposure, the said electric field will be substantially parallel to those features. This can greatly increase the efficiency of the exposure, producing inter alia greatly increased image contrast; see in this regard European patent application EP 0030852.9.

However, it may be desirable to change the state of polarization after the two patterned beams are combined. For instance, circularly polarized patterned beams may be less sensitive to polarization-dependent imaging properties of the projection system. The current embodiment therefore provides for the presence of a $\lambda/4$ plate 22 ("quarter wave plate") downstream of the polarizing beam combiner. With its main axes oriented at 45 degrees with respect to said S- and P-polarization directions, this plate will convert the combined patterned beam to a substantially circularly polarized patterned beam 2224 before it passes through the remainder of the optical system 23 and is imaged on the substrate 25.

The radiation systems 1 and 11 may comprise (either remote or integrated) radiation sources that produce linearly polarized light. This can be exploited to effect above-mentioned S- and P-polarization states of the patterned beams. It is also possible to secure said linear polarization states by means of linear polarizing filters placed at suitable locations in the first and second projection beams.

Figure 3:
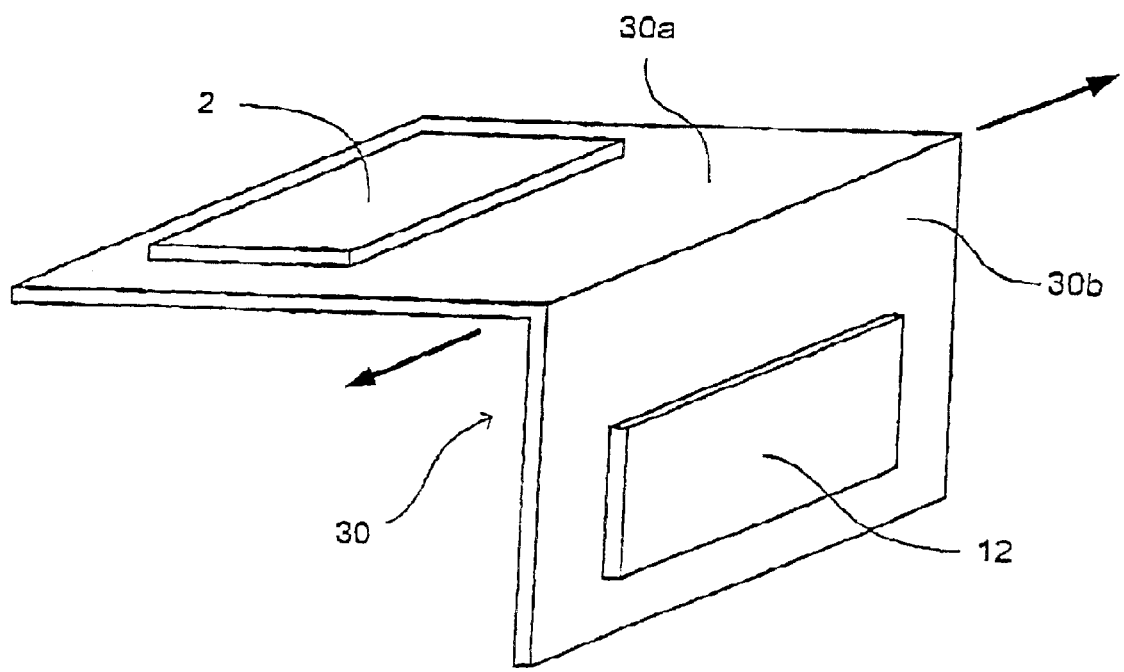
FIG. 3 depicts a patterning structure support structure according to at least one embodiment of the present invention.

As shown in FIG. 3, the two masks 2, 12 are mounted on a combined mask table 30. The first mask 2 is mounted horizontally on a first section 30a of the mask table and the second mask 12 is mounted vertically on a second section 30b of the mask table. This allows the two masks to be scanned together, with reduced risk of misalignment between the two exposures. A single long-stroke actuator is used to drive the mask table 30, while separate short-stroke actuators adjust the position of each of the masks 2, 12 relative to the mask table 30.

In a step-and-scan-type apparatus, the use of a single support structure for supporting the first patterning structure and the second patterning structure allows the first and second patterning structure to be simultaneously translated in the scanning direction using a single actuator. This reduces the possible alignment errors of the two exposures with respect to each other, reduces the complexity of the apparatus itself since it is not necessary to synchronize two separate scanning support structures, and reduces the cost of the apparatus since it avoids duplication of structures.

The two patterning structure may be supported on the support structure such that the major face of the first and second patterning structure are substantially mutually orthogonal in order to facilitate the projection of the two patterned beams onto the substrate.

A single long-stroke actuator may be used for positioning the support structure and first and second short-stroke actuators may be used to position the first and second patterning structure, respectively, relative to the support structure. This ensures that overlay errors between the first and second beams can be avoided and permits separate adjustment of each patterning structure to take account of, for example, the surface imperfections of each patterning structure.

In order to ensure that (given the fact that the exposure build-up at the substrate as a result of the energy supplied by both patterned beams involves a single scanning speed) the exposure doses of the two exposures are each within tolerance, variable attenuators are part of the radiation systems 1 and 11. With these variable attenuators the exposure dose of radiation impinging on the substrate target area can be tuned for each of the two patterned projection beams, independently of each other. One should note that a change of scan speed will affect the exposure dose for each patterned projection beam in the same way.

Since the second patterned beam is projected onto the substrate simultaneously with the first patterned beam, the mutual coherence between the two beams should be as low as possible in order to minimize interference between the two projected images. The concept of coherence involves the coherence length along the direction of propagation of the radiation (referred to hereafter by "temporal coherence") and the coherence length in a direction perpendicular to the direction of propagation (referred to hereafter as "spatial coherence"). The spatial coherence generally does not create a problem because radiation sources, such as excimer lasers or mercury arc lamps, typically generate light with a low spatial coherence. The spatial coherence is typically, for instance, so low that the phenomenon of speckle, which is directly related to spatial coherence, is not an issue for optical lithography. To avoid the occurrence of temporal coherence, the use of two separate radiation sources, one for each radiation system, is envisioned in at least one embodiment.

In at least one embodiment, the polarizing beam combiner is a plate beam splitter or a pellicle beam splitter, used as beam combiner. Cube-shaped polarizing beam combiners such as element 21 in FIG. 2 are usually made of two prism-shaped components (of which at least one is provided with a dielectric, beam-combining coating on the hypotenuse surface) bonded together at the hypotenuse surfaces. The occurrence of this bond may cause problems such as instability due to radiation impact, or out-gassing, causing contamination. Further, the presence of a cube-shaped element in the path traversed by the patterned beam may cause specific image aberrations that have to be corrected for (or at least have to be minimized) in the projection system. The use of a plate beam combiner or a pellicle beam combiner alleviates these problems. These beam combiners feature a single, planar-parallel substrate carrying a beam combiner coating so that an optical bond interface is absent. Further, the carrier substrate can be sufficiently thin (for instance of the order of microns in the case of a pellicle beam combiner) to avoid the occurrence of intolerable optical aberrations.

Figure 4:
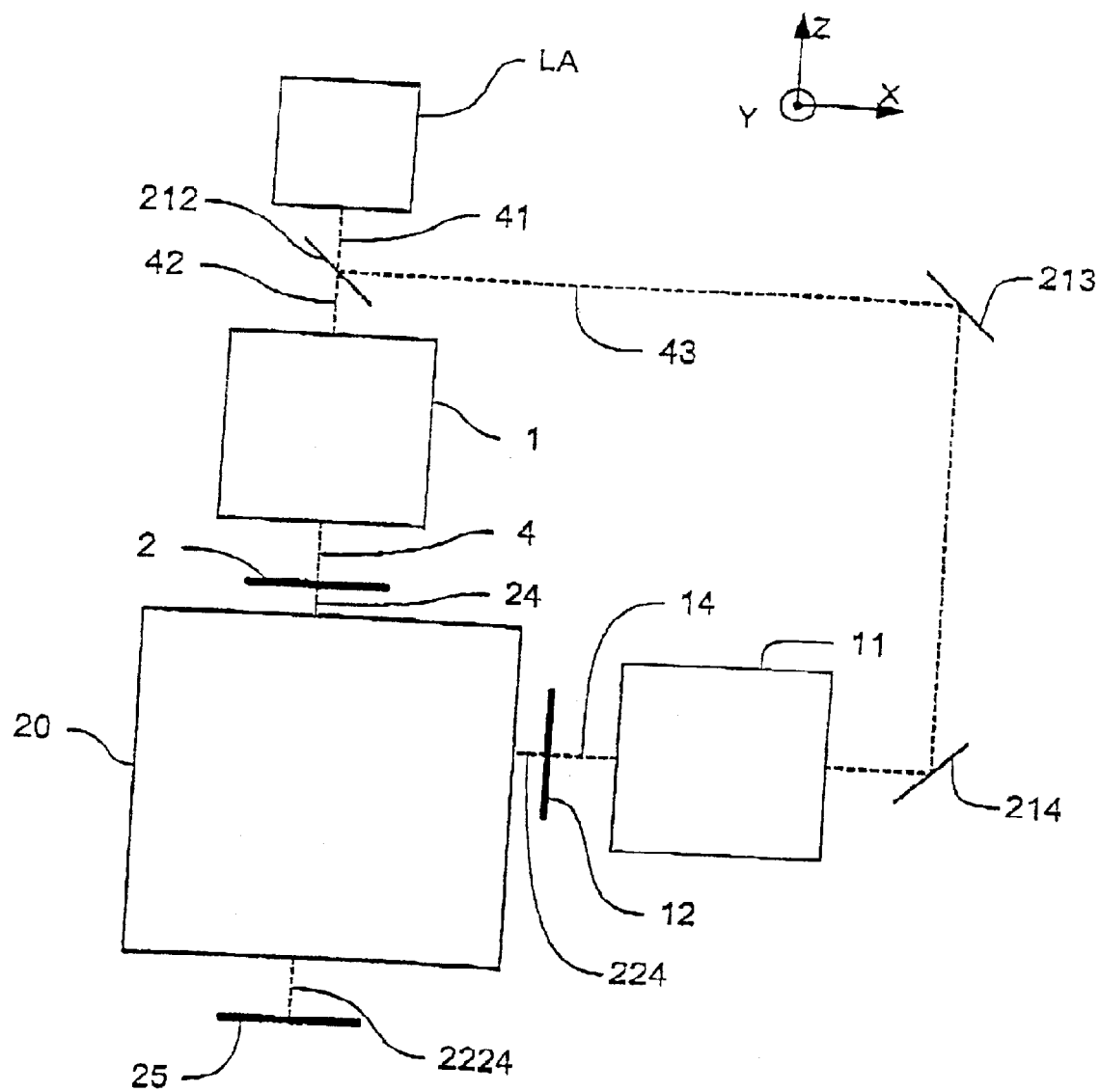
FIG. 4 shows where the first and second projection beam of radiation are supplied by a single radiation source according to at least one embodiment of the present invention.

At least one embodiment of the present invention is shown schematically in FIG. 4. Here, the projection beams of radiation 4 and 14, supplied by respectively the radiation systems 1 and 11, are produced by a single radiation source LA. The projection beam, 41 emanating from the source LA is divided by a beam splitter 212 into a first projection beam 42 supplied to radiation system 1, and a second projection beam 43, which traverses elements 213 and 214, and which is supplied to radiation system 2. The elements 213 and 214 can, for instance, be folding mirrors, as shown in FIG. 4.

A possible detrimental effect, caused by temporal coherence between the patterned beams 24 and 224 (in FIG. 4), is avoided due to the difference of pathlength of the two beams between the splitter 212 and the patterning structure 2, 12, respectively.

The beamsplitter 212 may be a polarizing beam splitter (for instance a polarizing plate beam splitter or a polarizing cube beam splitter). The fact that, in general, excimer lasers produce linearly polarized light, can then be exploited: by rotationally positioning the polarization of the laser at an angle of 45 degrees with respect to the x,y directions as shown in FIG. 4, the beamsplitter 212 will endow P- and S-polarization to the projection beams 42 and 43 respectively, while minimizing a loss of radiation energy. In addition, the use of linear polarizers, as mentioned above, can be avoided this way.

Figure 5:
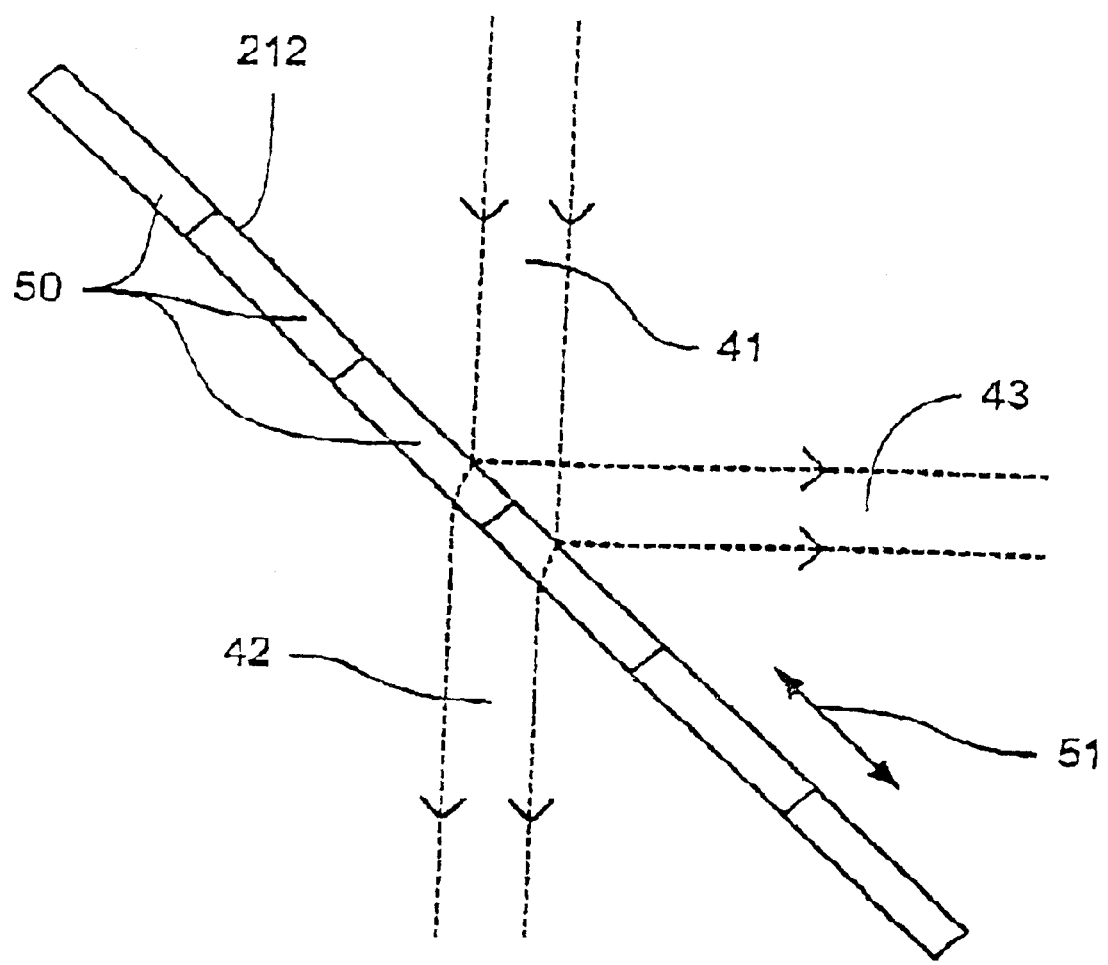
FIG. 5 depicts a beamsplitter comprising a plurality of beamsplitters arranged in parallel according to at least one embodiment of the present invention.

According to at least one embodiment, the beamsplitter 212 comprises a plurality of beamsplitters 50, arranged in parallel, as shown in FIG. 5. Each beam splitter 50 features a different ratio between the energy endowed to the transmitted beam and the energy endowed to the reflected beam. By moving the beamsplitter 212 in a direction parallel to the beam splitting surface, indicated by the arrow 51 in FIG. 5, the ratio between the exposure dose of the patterned radiation beam 24 and the patterned radiation beam 224 can be adjusted without substantially changing the energy of the combined patterned beam 2224. This adjustment means can be used simultaneously to set the required exposure dose for both patterned beams, given a single scanning speed. The use of variable attenuators, as mentioned above, for this purpose, can be avoided this way. Consequently, the required exposure dose can be effectuated at a higher scanning speed.

While specific embodiments of the invention have been described above, it will be appreciated that the invention may be practiced otherwise than as described. The description is not intended to limit the invention.

What is claimed is:

1. A lithographic projection apparatus comprising:
   a radiation system to provide a projection beam of radiation;
   a support structure to support patterning structure, the patterning structure serves to pattern the projection beam according to a desired pattern, and the support structure further supports supplementary patterning structure, the supplementary patterning structure serves to pattern a supplementary projection beam of radiation according to a supplementary pattern which is different to the pattern of the patterning structure;
   a long-stroke actuator to position the support structure;
   a first short-stroke actuator to position the patterning structure relative to the support structure;
   a second short-stroke actuator to position the supplementary patterning structure relative to the support structure:
   a substrate table to hold a substrate;
   a projection system to project the patterned beam onto a target portion of the substrate; and
   wherein the apparatus is configured to project the patterned beam and the supplementary patterned beam onto the substrate simultaneously such that the beams overlap at least partially, and
   wherein the apparatus is configured to move the substrate relative to the projection system during the simultaneous projection.

2. A lithographic projection apparatus according to claim 1, wherein the support structure supports both the patterning structure and the supplementary patterning structure such that the major face of each patterning structure is substantially orthogonal to the major face of the other patterning structure.

3. A lithographic projection apparatus according to claim 1, wherein the projection system combines both the patterned beam and the supplementary patterned beam and projects the combined beam onto the target portion of the substrate.

4. The lithographic projection apparatus according to claim 3, wherein the combined beam is substantially circularly polarized.

5. A lithographic projection apparatus according to claim 1, wherein the supplementary projection beam is provided by a supplementary radiation system.

6. A lithographic projection apparatus according to claim 5, wherein at least one of the radiation system and the supplementary radiation system comprises a radiation source.

7. A lithographic projection apparatus according to claim 5, further comprising a single radiation source for supplying a beam of radiation to the radiation system and to the supplementary radiation system.

8. A lithographic projection apparatus according to claim 1, wherein both the projection beam and the supplementary projection beam are plane polarized beams.

9. A lithographic projection apparatus according to claim 8, wherein the projection beam and the supplementary projection beam are combined using a polarizing beam-combiner.

10. A lithographic projection apparatus according to claim 9, wherein the polarizing beam-combiner is part of the projection system, and the projection system further comprises a $\lambda/4$ plate.

11. The lithographic projection apparatus according to claim 8, wherein the direction of polarization of the patterned beam is substantially orthogonal to the direction of polarization of the supplementary patterned beam.

12. A lithographic projection apparatus according to claim 1, wherein the projection beam and the supplementary projection beam are substantially mutually incoherent.

13. A lithographic projection apparatus according claim 1, wherein both the patterning structure and the supplementary patterning structure are masks.

14. A lithographic projection apparatus according to claim 1, wherein the radiation system comprises a radiation source.

15. The lithographic projection apparatus according to claim 1, wherein said apparatus is configured to simultaneously move the patterning structure and the substrate during the simultaneous projection.

16. The lithographic projection apparatus according to claim 1, wherein the support structure is configured to move the patterning structure relative to the projection beam.

17. A device manufacturing method comprising:
providing a substrate that is at least partially covered by a layer of radiation-sensitive material;
providing a projection beam of radiation using a radiation system;
supporting a patterning structure on a support structure and using it to endow the projection beam with a pattern in its cross-section;
using a long-stroke actuator to position the support structure;
using a first short-stroke actuator to position the patterning structure relative to the support structure:
projecting the patterned beam of radiation onto a target portion of the layer of radiation-sensitive material;
providing a supplementary projection beam of radiation;
supporting a supplementary patterning structure on the support structure and using it to endow the supplementary projection beam with a pattern in its cross section that is different to the pattern of the patterning structure;
using a second short-stroke actuator to position the supplementary patterning structure relative to the support structure; and
projecting the supplementary patterned beam onto the layer of radiation-sensitive material simultaneously with the patterned beam such that the beams overlap at least partially,
wherein the substrate is moved relative to the projection system during said projecting the supplementary patterned beam simultaneously with the patterned beam.

18. A device manufactured according to the method of claim 17.

19. The device manufacturing method according to claim 17, wherein said method includes simultaneously moving the patterning structure and the substrate during said projecting the supplementary patterned beam simultaneously with the patterned beam.

20. The device manufacturing method according to claim 17, wherein supporting a patterning structure includes moving the patterning structure relative to the projection beam.

21. The device manufacturing method according to claim 17, wherein supporting a supplementary patterning structure includes supporting the supplementary patterning structure such that the major face of the supplementary patterning structure is substantially orthogonal to the major face of the patterning structure.

22. The device manufacturing method according to claim 17, wherein the patterned beam and the supplementary patterned beam are plane polarized.

23. The device manufacturing method according to claim 22, wherein the direction of polarization of the patterned beam is substantially orthogonal to the direction of polarization of the supplementary patterned beam.

24. A device manufacturing method comprising:
providing a substrate that is at least partially covered by a layer of radiation-sensitive material;
providing a projection beam of radiation using a radiation system;
supporting a patterning structure on a support structure and using it to endow the projection beam with a pattern in its cross-section;
projecting the patterned beam of radiation onto a target portion of the layer of radiation-sensitive material;
providing a supplementary projection beam of radiation;
supporting a supplementary patterning structure on the support structure and using it to endow the supplementary projection beam with a pattern in its cross section that is different to the pattern of the patterning structure;
using a long-stroke actuator to position the support structure;
using a first short-stroke actuator to position the patterning structure relative to the support structure;
using a second short-stroke actuator to position the supplementary patterning structure relative to the support structure; and
projecting the supplementary patterned beam onto the layer of radiation-sensitive material simultaneously with the patterned beam such that the beams overlap at least partially,
wherein the patterned beam and the supplementary patterned beam are substantially mutually incoherent.

25. The device manufacturing method according to claim 24, wherein supporting a patterning structure includes moving the patterning structure relative to the projection beam.

26. A device manufacturing method according to claim 25, wherein said moving the patterning structure relative to the projection beam includes using the long-stroke actuator to position the support structure while the first short-stroke actuator adjusts a position of the patterning structure relative to the support structure and the second short-stroke actuator adjusts a position of the supplementary patterning structure relative to the support structure.

27. The device manufacturing method according to claim 24, wherein supporting a supplementary patterning structure includes supporting the supplementary patterning structure such that the major face of the supplementary patterning structure is substantially orthogonal to the major face of the patterning structure.

28. The device manufacturing method according to claim 24, wherein said method includes simultaneously moving the patterning structure and the substrate during said projecting the supplementary patterned beam simultaneously with the patterned beam.

* * * * *